United States Patent [19]

Flamm

[11] 4,314,875

[45] Feb. 9, 1982

[54] DEVICE FABRICATION BY PLASMA ETCHING

[75] Inventor: Daniel L. Flamm, Chatham Township, Morris County, N.J.

[73] Assignee: Bell Telephone Laboratories, Incorporated, Murray Hill, N.J.

[21] Appl. No.: 149,470

[22] Filed: May 13, 1980

[51] Int. Cl.³ .......................................... H01L 21/306
[52] U.S. Cl. .................................. 156/643; 156/646; 156/657; 156/659.1; 156/662; 204/192 E; 252/79.1
[58] Field of Search ............ 156/643, 646, 657, 659.1, 156/662; 252/79.1; 204/192 E, 298; 250/492; 427/38, 39

[56] References Cited

U.S. PATENT DOCUMENTS 4,162,185 7/1979 Cobunn et al. ...................... 156/643
4,211,601 7/1980 Mogab .................................. 156/643

Primary Examiner—William A. Powell
Attorney, Agent, or Firm—George S. Indig

[57] ABSTRACT

Etch rate in plasma-assisted etching is increased by inclusion of an additional oxidant. The oxidant increases consumption of unsaturates in the plasma to increase etchant species lifetime and to suppress polymer formation.

10 Claims, No Drawings

DEVICE FABRICATION BY PLASMA ETCHING

BACKGROUND OF THE INVENTION

A. Technical Field

The field involves device fabrication in which material is selectively removed by plasma-assisted etching. A significant category of devices is silicon integrated circuitry with sufficient integration to yield large scale integration or even very large scale integration.

B. History

Device design trend toward increasing miniaturization has resulted in the need to define features of the order of micrometers and less. This trend is resulting in replacement of the liquid etch processes so useful for small and medium scale integration with varieties of dry processing.

Dry processing so desirable for a variety of reasons—e.g., relative freedom from condensed phase contaminant—often takes the form of plasma-assisted etching.

Plasma-assisted etch processes are identified by various designations—e.g., plasma etching, reactive ion etching, etc. With the exception of ion milling which is normally practiced with argon or other inert species, some considerable part of material removal is due to chemical reaction (as distinguished from momentum transfer).

Such plasma-assisted etch processes generally depend upon a plasma-derived species which acts as oxidant for the material to be removed. Typical oxidants are atomic chlorine and atomic bromine.

Plasma compositions commonly include other species. Additional species may be or may yield chemically unsaturated compounds or radicals. This additional species may be unsaturated as introduced into the plasma or may be derived from freon or some compound of higher oxidation state by action of the plasma. Unsaturated material may not be deliberate but may be a by-product—e.g., of etchant generation. Accordingly, a freon may be introduced to yield monatomic fluorine etchant with such precursor contributing unsaturated radical, as well. In other instances, a precursor compound yielding unsaturate is introduced to control etch profile and/or to minimize "loading" (etch rate dependence upon surface area revealed). See, for example, "The Loading Effect in Plasma Etching" by C. J. Mogab, *Journal of the Electrochemical Society*, Vol. 124, No. 8, (August 1977).

A necessary consequence of unsaturate presence is etchant species consumption. Etchant species consumed by combination with unsaturate necessarily results in reduction of etch rate.

SUMMARY OF THE INVENTION

Plasma-assisted etchant compositions including unsaturate, etchant species and an additional oxidant permit enhanced etch rate relative to compositions not containing the additional oxidant. The additional oxidant serves to consume unsaturate and, thereby, liberates etchant species and results in increased etch rate. The additional constituent provides an additional degree of freedom in plasma composition, thereby affording control over such relevant factors as profile, selectivity, etc.

In preferred embodiments, the additional oxidant is more reactive than the primary etchant species so that increased etch rate is realized with relatively small concentrations of additional oxidant.

The inventive premise is enhancement of etching by the designated etchant species. This, in turn, gives rise to a preference for an amount of additional oxidant no greater than that required to consume unsaturate in the plasma. A preferred embodiment assures this preference by use of additional oxidant which is more reactive than the etchant. Such embodiments are illustrated by—e.g., plasma-derived monatomic species of chlorine, fluorine, or oxygen as additional oxidants—in this instance, for a bromine etchant species and fluorine or oxygen additional oxidant in the instance of chlorine etchant species. Consumption of unsaturate by additional oxidant impedes polymer formation which is desirable in itself and may increase effective etch rate (as well as homogeneity).

DETAILED DESCRIPTION

1. General

The inventive concept involves liberation of plasma-derived etchant species by incorporation of an additional oxidant. The function of the additional oxidant is to consume unsaturates. Unsaturates may otherwise combine with etchant species to reduce etch rate or may polymerize to result in inhomogeneous etching. Generically, reaction between unsaturate and additional oxidant is not necessarily thermodynamically preferred over reaction with etchant species so that significant liberation of the latter may be dependent upon a concentration effect of additional oxidant. Preferred embodiments rely upon an additional oxidant which preferentially reacts with unsaturate, thereby yielding more etchant species with effectiveness approaching unity in terms of the atom fraction of liberated etchant species /additional oxidant. Preferred embodiments as so defined are primarily based on etchant species of chlorine or bromine and, under some circumstances, oxygen, with additional oxidant constituting, respectively, fluorine or oxygen for chlorine etchant; and chlorine, fluorine, or oxygen for bromine etchant. The premise upon which such preferred embodiments is based is the desirability of etching with such designated etchant species (rather than with additional oxidant).

It follows that the most preferred embodiment involves incorporation of additional oxidant in amount only to consume unsaturate, since excessive amounts under usual circumstances, result in etching by additional oxidant.

2. Composition

It is convenient to discuss composition in terms of plasma components. In general, such components are plasma derived.

Contemplated unsaturates prominently include halocarbons which may be charged but are generally neutral. The term "unsaturate" here has reference to conventional ethylenic or higher order unsaturation, but also includes, e.g., $CF_2$, $CFBr$, or other halogenated carbons which are equally reactive and which may combine to form unsaturate. Examples are: $C_2F_4$, $C_3F_6$, $C_2F_2Cl_2$, $C_2F_2Br_2$, as well as $CF_2$, $CFBr$, $CBr_2$, $CFCl$, etc.

"Etchant" species, with reference to semiconductor and other integrated circuit technology, contemplate oxidants, such as, chlorine, bromine, and oxygen. Actual etchant species likely as plasma-derived, may be monatomic or diatomic. In general, etching behavior is satisfactorily explained in terms of neutral monatomic species, and it is convenient to discuss the invention in these terms. In any event, such oxidants may result from introduction of diatomic precursor as well as more complex heteroatomic compositions.

*Additional oxidant* is chemically different from the etchant species. In preferred embodiments, it is at least as reactive and, preferably, more reactive than the etchant species, at least with respect to reaction with unsaturate. Like etchant species, additional oxidant is discussed in terms of neutral atoms even though reactions may involve diatomic species.

Additional oxidant is generally derived from precursor which may include the corresponding diatomic species—e.g., $F_2$, $O_2$, $Cl_2$, or in the alternative, may include heteroatomic compositions, $NF_3$, $ClF_3$, $BrF_3$. The three-named heteroatomic compounds are prominent sources of atomic fluorine.

Relative amounts of unsaturate and etchant species are usually inherent for chosen system and parameters. As indicated, unsaturate may not be intentional but may be introduced as by product of compounds designed to control, inter alia, profile, discrimination, etc. Prior work deals with etch systems relevant to such considerations—see, for example, U.S. application, Ser. No. 929,569 filed July 31, 1978, now U.S. Pat. No. 4,211,601, and U.S. application, Ser. No. 929,549 filed July 31, 1978, now U.S. Pat. No. 4,208,241. Designation of appropriate compositional ranges is often empirical. Such compositions depend upon a variety of factors including apparatus design, power input, temperature, surface composition, resist composition, etc.

Additional oxidant concentration may also be determined empirically, for example, simply in terms of increasing etch rate. Additional oxidant content may be determined empirically by monitoring unsaturates by mass spectroscopy. Minimum desired content corresponds with measurable decrease in unsaturate. Concentration corresponding with the preferred embodiment is empirically determinable by monitoring optical atomic emission lines of the additional oxidant, itself.

Unsaturate may be directly monitored by mass spectroscopy at the plasma position, or, alternatively, resulting reaction product may be monitored in the effluent. Examples of the latter are seen in terms of $C_2F_3Cl_2^+$, $(CF_2)_3Cl^+$, $(CF_2)_3F^+$, $(CF_2)_3BrF^+$, $CF_2Br_2^+$, etc.

Increasing emission amplitude for additional oxidant as concentration is increased corresponds with excess over what is required to consume unsaturate.

In embodiments in which additional oxidant combines preferentially with unsaturate (relative to etchant species), an etch-rate significant minimum concentration of additional oxidant may be defined. Introduction of additional oxidant precursor with an atom content of additional oxidant at least equal to 10 percent of atom content of etchant species in its precursor results in sufficient introduction into the plasma to result in measurable increase in etch rate due to consumption of unsaturate. The effect of such minimum is to replace etchant species in the recombination reaction with unsaturate and, accordingly, to free etchant species virtually on a 1:1 basis (for preferred embodiments in which the additional oxidant is a strong oxidizing agent relative to the etchant species).

3. Processing Parameters

As indicated, processing parameters are largely determined on usual bases. Apparatus design is dictated by general fabrication requirements. Processing conditions are also generally independent of the specific inventive teaching. These concern such matters as etch rate, plasma uniformity, profile, required selectivity, design rule dimensions, etc. For LSI manufacture, power limits are likely to be within the range of 0.1 watt/cm$^3$ to a few watts/cm$^3$. Pressure limits in conventional plasma etching are likely to range from 0.1 to 1 or a few torr. The range is extended to higher vacuum for procedures such as reactive ion etching. Overall pressure limits may be specified as from $10^{-3}$ Torr to 20.0 Torr.

Divergence from isotropic etching is realized through proper selection of systems (and the nature and amount of additional oxidant in accordance with the present invention becomes a factor in this consideration). Anisotropy is also favored for greater particle temperatures which are realized through increasing power and/or decreasing pressure.

These and other conditions vary in accordance with apparatus design and other circumstances well known to the worker in the field. A more complete discussion is considered outside the necessary scope of this teaching.

4. Examples

The following Examples are conducted on a radial flow reactor of parallel plate design. Plates are of a diameter of about 17 inches. Electrode plates spacing is from 5–50 mm. Plates are deposed horizontally with the lower maintained at ground potential. Power at rf frequency of 13.56 MHz is applied to the upper (driven) plate to sustain discharge. Apparatus design permits pressure in the range $10^{-3}$ torr to 2.0 torr; flow rate from 10–500 sccm; power 100–3000 watts. The grounded electrode serves as the substrate and is maintained at a temperature of from 25–250 degrees C.

EXAMPLE 1

A partially masked surface layer of photoresist of a thickness of 0.5 $\mu$m on a 3 inch silicon wafer is etched within a plasma produced from precursor gas $CF_3Cl$, with conditions: 300 watts; 0.35 Torr; 31 mm electrode spacing; 25 degrees C. substrate; 200 sccm reactant flow rate. Etch rate is measured at 280 Angstroms/min. Mass spectra shows the plasma effluent to include the following constituents (units assigned to concentrations are in terms of ion line amplitudes as measured on the mass spectrometer): 0.0015 $C_2F_3Cl_2^+$, 0.0007 $(CF_2)_3F^+$, 0.0003 $(CF_2)_3Cl^+$ of partially combined unsaturated materials and 2.5 units of atomic Cl emission at 725.6 nm as measured with a detector-monochrometer combination.

EXAMPLE 2

In this Example, the conditions of Example 1 are repeated, however, including 20 percent of $O_2$ (additional oxidant precursor). Etch rate is seen to increase to a rate of approximately 370 Angstroms/min. which is consistent with the emission spectrometer indication of an increase of 30 percent in the 725.6 nm Cl emission of Example 1. The higher unsaturate derivatives (($CF_2$)$_3$ . . . ) are found to be eliminated and the $C_2F_3Cl_2^+$ peak is reduced by almost 50 percent consistent with the increase in etch rate and with the stronger oxidizing influence of the additional oxidant.

Examples 3 through 5 are presented in tabular form with examples—e.g., 3,4, 5, etc.—conducted under the same conditions 500 watt, 0.2 Torr. as noted. Flow rates are maintained constant at 250 sccm so that the actual amount of effective etchant precursor, $CF_3Br$, introduced is decreased by an amount corresponding with the addition of additional oxidant.

TABLE I

| Example | Higher Unsaturate Derivatives | Additional Oxidant | Etch Rate |
| --- | --- | --- | --- |
| 3 | .01 Units | None | 600A/Min. |
| 4 | 0 | 20% $O_2$ | 800A/Min. |
| 5 | 0 | 20% $NF_3$ | 700A/Min. |

Other data not tabulated relates, for example, to increasing added oxidant to maxima beyond which this added ingredient, itself, becomes an effective etchant. For example, use of the system $CF_3Br$-50% $NF_3$ for silicon etching, results in atomic F emission at 703.4 nm at an amplitude estimated as indicating an amount equal to bromine (635.1 nm).

I claim:

1. Process for fabrication of an article comprising at least one operation during which the article undergoing fabrication comprises a surface of material to be etched wherein the said article is etched within a plasma environment contained within an apparatus, the plasma resulting from imposition of an electrical field across gaseous reactant between two electrodes, etching being primarily due to chemical reaction with the said material to be etched, the said gaseous reactant including an effective etchant precursor for yielding a plasma-derived effective etchant primarily responsible for the said chemical reaction and an unsaturate precursor which yields ethylenically unsaturated material or radical which may yield unsaturated material here designated as "unsaturate" which may combine with effective etchant to reduce the amount of available effective etchant, characterized in that the said gaseous reactant includes an oxidant precursor which yields an additional oxidant which combines with unsaturate to result in reduced reaction between unsaturate and effective etchant and thereby increase concentration of effective etchant whereby the rate of the said chemical reaction is increased.

2. Process of claim 1 in which etchant precursor and unsaturate precursor are a single compound.

3. Process of claim 1 in which polymerization of unsaturate is inhibited by additional oxidant.

4. Process of claim 1 in which the additional oxidant is a stronger oxidizing agent with respect to the said unsaturate than is the said effective etchant.

5. Process of claim 4 in which the said unsaturate contains fluorine and ethylenically bonded carbon.

6. Process of claim 1 in which the effective etchant precursor includes at least one element selected from the group consisting of chlorine and bromine.

7. Process of claim 6 in which the added oxidant precursor includes at least one element selected from the group consisting of fluorine and oxygen, when the effective etchant precursor includes chlorine, and in which the added oxidant precursor includes an element selected from the group consisting of chlorine, fluorine, and oxygen when the effective etchant precursor includes bromine.

8. Process of claim 1 in which the added oxidant precursor is at least one molecular species selected from the group consisting of $NF_3$, $ClF_3$, $BrF_3$, $F_2$, $O_2$, and $Cl_2$.

9. Process of claim 1 in which the said precursors include a halocarbon.

10. Process of claim 1 in which the said additional oxidant precursor has an atom content of additional oxidant at least equal to 10 percent of the atom content of etchant species in the said etchant precursor.

* * * * *